(12) United States Patent
Scholz et al.

(10) Patent No.: US 9,115,444 B2
(45) Date of Patent: Aug. 25, 2015

(54) METHOD FOR PRODUCING III-N LAYERS, AND III-N LAYERS OR III-N SUBSTRATES, AND DEVICES BASED THEREON

(75) Inventors: Ferdinand Scholz, Ulm (DE); Peter Brückner, Tettnang (DE); Frank Habel, Freiberg (DE); Matthias Peter, Alteglofsheim (DE); Klaus Köhler, Freiburg (DE)

(73) Assignees: FREIBERGER COMPOUND MATERIALS GMBH, Freiberg (DE); OSRAM OPTO SEMICONDUCTORS GMBH, Regensburg (DE)

( * ) Notice: Subject to any disclaimer, the term of this patent is extended or adjusted under 35 U.S.C. 154(b) by 1327 days.

(21) Appl. No.: 12/896,352

(22) Filed: Oct. 1, 2010

(65) Prior Publication Data

US 2011/0018106 A1 Jan. 27, 2011

Related U.S. Application Data

(62) Division of application No. 11/913,739, filed as application No. PCT/EP2006/004233 on May 5, 2006.

(30) Foreign Application Priority Data

May 6, 2005 (DE) .......................... 10 2005 021 099

(51) Int. Cl.
*H01L 21/02* (2006.01)
*C30B 29/40* (2006.01)
*C30B 25/02* (2006.01)

(52) U.S. Cl.
CPC ............... *C30B 29/406* (2013.01); *C30B 25/02* (2013.01); *H01L 21/0242* (2013.01);

(Continued)

(58) Field of Classification Search
USPC ................................ 117/942, 86, 89, 90, 104
See application file for complete search history.

(56) References Cited

U.S. PATENT DOCUMENTS

| 5,637,531 A | 6/1997 | Porowski et al. |
| 6,083,812 A | 7/2000 | Summerfelt |

(Continued)

FOREIGN PATENT DOCUMENTS

| CN | 1670918 A | 9/2005 |
| EP | 1 577 933 A2 | 9/2005 |

(Continued)

OTHER PUBLICATIONS

L. Liu et al., "Substrates for gallium nitride epitaxy", Materials Science and Engineering Reports, vol. 37 (2002), pp. 61-127.

(Continued)

*Primary Examiner* — Robert M Kunemund
(74) *Attorney, Agent, or Firm* — Foley & Lardner LLP

(57) ABSTRACT

An epitaxial growth process for producing a thick III-N layer, wherein III denotes at least one element of group III of the periodic table of elements, is disclosed, wherein a thick III-N layer is deposited above a foreign substrate. The epitaxial growth process preferably is carried out by HVPE. The substrate can also be a template comprising the foreign substrate and at least one thin III-N intermediate layer. The surface quality is improved by providing a slight intentional misorientation of the substrate, and/or a reduction of the N/III ratio and/or the reactor pressure towards the end of the epitaxial growth process. Substrates and semiconductor devices with such improved III-N layers are also disclosed.

13 Claims, 3 Drawing Sheets

(52) U.S. Cl.
CPC ....... *H01L 21/0254* (2013.01); *H01L 21/0262* (2013.01); *H01L 21/02433* (2013.01); *Y10S 117/915* (2013.01); *Y10T 428/24355* (2015.01)

(56) References Cited

U.S. PATENT DOCUMENTS

| | | |
|---|---|---|
| 6,447,604 B1 | 9/2002 | Flynn et al. |
| 6,501,154 B2 | 12/2002 | Morita et al. |
| 6,586,819 B2 | 7/2003 | Matsuoka |
| 6,734,530 B2 | 5/2004 | Ban |
| 7,064,357 B2 | 6/2006 | Ueta et al. |
| 7,118,813 B2 | 10/2006 | Xu et al. |
| 7,220,658 B2 | 5/2007 | Haskell et al. |
| 7,352,012 B2 | 4/2008 | Ueta et al. |
| 7,390,581 B2 | 6/2008 | Xu et al. |
| 7,435,608 B2 | 10/2008 | Shibata |
| 7,700,203 B2 | 4/2010 | Xu et al. |
| 7,847,293 B2 | 12/2010 | Haskell et al. |
| 8,043,731 B2 | 10/2011 | Xu et al. |
| 2001/0030329 A1 | 10/2001 | Ueta et al. |
| 2002/0171092 A1 | 11/2002 | Goetz et al. |
| 2003/0001238 A1 | 1/2003 | Ban |
| 2003/0024472 A1 | 2/2003 | Maruska et al. |
| 2003/0127041 A1 | 7/2003 | Xu et al. |
| 2004/0144300 A1 | 7/2004 | Kitaoka et al. |
| 2005/0048685 A1 | 3/2005 | Shibata |
| 2005/0076828 A1 | 4/2005 | Taki et al. |
| 2005/0104162 A1 | 5/2005 | Xu et al. |
| 2005/0208687 A1 | 9/2005 | Kasai et al. |
| 2005/0274976 A1 | 12/2005 | Shibata |
| 2006/0128124 A1 | 6/2006 | Haskell et al. |
| 2006/0189012 A1 | 8/2006 | Ueta et al. |
| 2006/0228584 A1 | 10/2006 | Xu et al. |
| 2007/0040219 A1 | 2/2007 | Shibata |
| 2007/0126023 A1 | 6/2007 | Haskell et al. |
| 2008/0199649 A1 | 8/2008 | Xu et al. |
| 2008/0219910 A1 | 9/2008 | Kasai et al. |
| 2010/0148320 A1 | 6/2010 | Xu et al. |
| 2011/0278585 A1 | 11/2011 | Haskell et al. |
| 2012/0074425 A1 | 3/2012 | Haskell et al. |

FOREIGN PATENT DOCUMENTS

| | | |
|---|---|---|
| EP | 1 852 897 A1 | 11/2007 |
| JP | 2000-156348 A | 6/2000 |
| JP | 2000-223743 A | 8/2000 |
| JP | 2001-158691 A | 6/2001 |
| JP | 2001-196632 A | 7/2001 |
| JP | 2002-145700 A | 5/2002 |
| JP | 2002-274997 A | 9/2002 |
| JP | 2003-012398 A | 1/2003 |
| JP | 2003-060318 A | 2/2003 |
| JP | 2003-347226 A | 12/2003 |
| JP | 2004-502298 A | 1/2004 |
| JP | 2004-099337 A | 4/2004 |
| JP | 2005-072310 A | 3/2005 |
| JP | 2005-150287 A | 6/2005 |
| JP | 2005-298319 A | 10/2005 |
| JP | 2005-343713 A | 12/2005 |
| JP | 2006-514780 A | 5/2006 |
| JP | 2007-534159 A | 11/2007 |
| WO | WO 2004/061969 A1 | 7/2004 |

OTHER PUBLICATIONS

I. Grzegory et al., "B1.1 High pressure solution growth of GaN and related compounds", Gallium Nitride and Related Semiconductors, INSPEC, The Institution of Electrical Engineers (1999), pp. 359-366.

Sung S. Park et al., "Free-Standing GaN Substrates by Hydride Vapor Phase Epitaxy", Jpn. J. Appl. Phys., vol. 39 (2000), pp. L1141-L1142.

Xueping Xu et al., "Growth and characterization of low defect GaN by hydride vapor phase epitaxy", Journal of Crystal Growth, vol. 246 (2002), pp. 223-229.

T. Paskova et al., "Thick Hydride Vapour Phase Epitaxial GaN Layers Grown on Sapphire with Different Buffers", Phys. Stat. Sol. (a), vol. 176 (1999), pp. 415-419.

Shin-Ichi Nagahama et al., "Wavelength Dependence of InGaN Laser Diode Characteristics", Jpn. J. Appl. Phys., vol. 40 (2001), pp. 3075-3081.

Masaru Kuramoto et al., "Room-Temperature Continuous-Wave Operation of InGaN Multi-Quantum-Well Laser Diodes Grown on an n-GaN Substrate with a Backside n-Contact", Jpn. J. Appl. Phys., vol. 38 (1999), pp. L184-L186.

X. A. Cao et al., "Blue and near-ultraviolet light-emitting diodes on free-standing GaN substrates", Applied Physics Letters, vol. 84, No. 21 (2004), pp. 4313-4315.

B. Kuhn et al., "An Oxygen Doped Nucleation Layer for the Growth of High Optical Quality GaN on Sapphire", Phys. Stat. Sol., vol. (a), vol. 188, No. 2 (2001), pp. 629-633.

Frank Habel et al., "Marker layers for the development of a multistep GaN FACELO process", Journal of Crystal Growth, vol. 272 (2004), pp. 515-519.

Peter Brückner et al., "HVPE growth of high quality GaN layers", Phys. Stat. sol. (c), vol. 3, No. 6 (2006), pp. 1471-1474.

Frank Habel et al., "Hydride vapor phase epitaxial growth of thick GaN layers with improved surface flatness", Phys. Stat. Sol. (c), vol. 2, No. 7 (2005), pp. 2049-2052.

Takayuki Yuasa et al., "Effect of Slight Misorientation of Sapphire Substrate on Metalorganic Chemical Vapor Deposition Growth of GaN", Jpn. J. Appl. Phys., vol. 38 (1999), pp. L703-L705.

D. Lu et al., "Sapphire substrate misorientation effects on GaN nucleation layer properties", Journal of Crystal Growth, vol. 272 (2004), pp. 353-359.

Yu. N. Drozdov et al., "Effect of the Parameters of Sapphire Substrates on the Crystalline Quality of GaN Layers", Semiconductors, vol. 39, No. 1 (2005), pp. 1-3.

Qing Paduano et al., "Optimized Coalescence Method for the Metalorganic Chemical Vapor Deposition (MOCVD) Growth of High Quality Al-Polarity AlN Films on Sapphire", Jpn. J. Appl. Phys., vol. 44, No. 4 (2005), pp. L150-L152.

Akio Sasaki, "Initial growth layers and critical thickness of InAs heteroepitaxy on GaAs substrates", Journal of Crystal Growth, vol. 160 (1996), pp. 27-35.

M. Razeghi et al., "Growth and Characterization of InP Using Metalorganic Chemical Vapor Deposition at Reduced Pressure", Journal of Crystal Growth, vol. 64 (1983), pp. 76-82.

M. J. McCollum et al., "High Purity InP Grown by Hydride Vapor Phase Epitaxy", Academic Press, Semiconductors and Semimetals, vol. 31, Chap. 2 (1990), pp. 37, and 44-47.

Horst Haspeklo, "Dotierungs- und Grenzflaechenuntersuchungen bei InP Epitaxieschichten", Physikalisches Institut der Universitaet Stuttgart (1984), 4 pgs.

J. V. Dilorenzo, "Vapor Growth of Epitaxial GaAs: A Summary of Parameters which Influence the Purity and Morphology of Epitaxial Layers", Journal of Crystal Growth, vol. 17 (1972), pp. 189-206.

Olivier Parillaud et al., "HVPE and MOVPE GaN growth on slightly misoriented sapphire substrates", Institut de Micro- et Optoélectronique, MRS Internet J. Nitride Semicond. Res. 5S1, W3.12 (2000), 6 pgs.

B. Pécz et al., "Growth of GaN layers onto misoriented (0001) sapphire by metalorganic chemical vapor deposition", Journal of Applied Physics, vol. 86, No. 11 (1999), pp. 6059-6067.

Kazumasa Hiramatsu et al., "MOVPE growth of GaN on a misoriented sapphire substrate", Journal of Crystal Growth, vol. 107 (1991), pp. 509-512.

W. K. Burton et al., "The Growth of Crystals and the Equilibrium Structure of their Surfaces", Philosophical Transactions of the Royal Society of London, Series A, Mathematical and Physical Sciences, vol. 243 (1951), pp. 299-358.

F. Scholz, U.S. PTO Office Action, U.S. Appl. No. 11/913,739, dated Nov. 9, 2010, 11 pages.

F. Scholz, U.S. PTO Notice of Allowance, U.S. Appl. No. 11/913,739, dated Apr. 14, 2011, 7 pages.

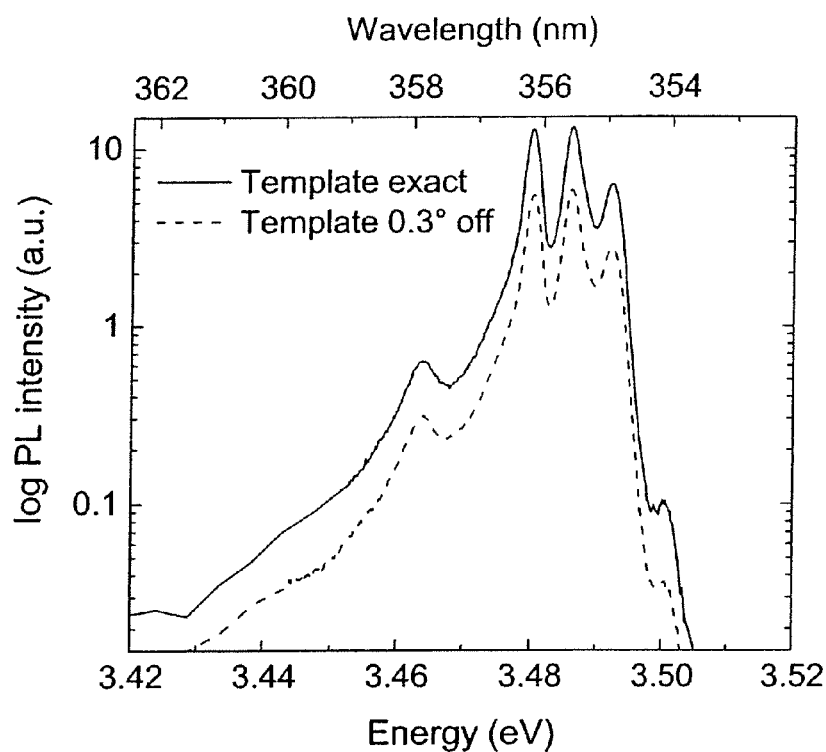
Fig. 1
Fig. 2A
Fig. 2B
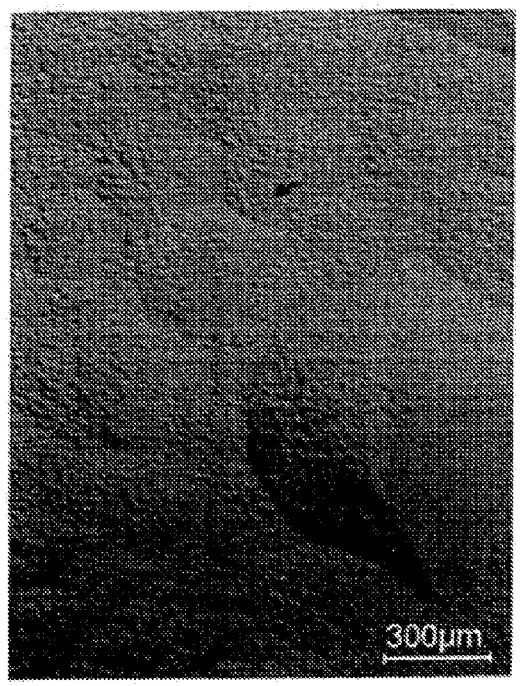
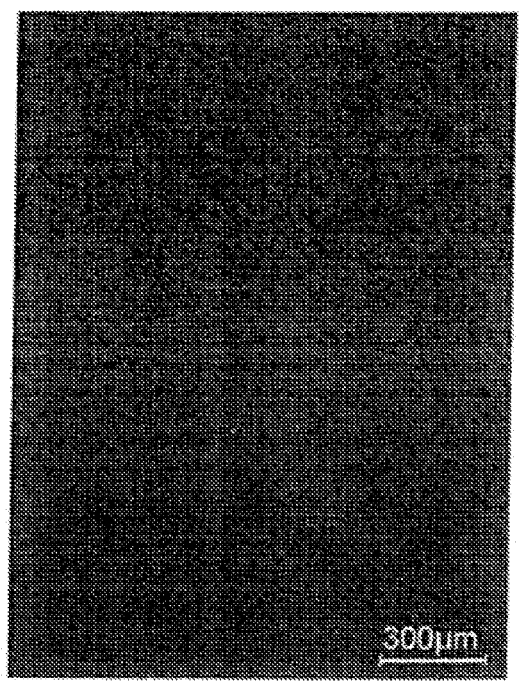

Without any optimization:

Change in the V/III-ratio:

Optimized conditions:

exact        0.3° miscut        0.6° miscut

METHOD FOR PRODUCING III-N LAYERS, AND III-N LAYERS OR III-N SUBSTRATES, AND DEVICES BASED THEREON

CROSS-REFERENCE TO RELATED APPLICATIONS

The present application is a Divisional of U.S. application Ser. No. 11/913,739, filed Nov. 6, 2007, which is a National Stage Application of PCT No. PCT/EP2006/004233 filed May 5, 2006, and claims the benefit of priority from prior Federal Republic of Germany Patent Application No. 102005021099.6, filed May 6, 2005, the entire contents of each of these applications are incorporated herein by reference.

The present invention relates to a method for producing a thick III-N layer and a III-N substrate, where N is nitrogen and III is at least one element from group III of the periodic table of elements, in particular one or more elements selected from Al, Ga and In (in the following briefly denoted as III-N), as well as to thick III-N layers and III-N substrates with improved surface morphology. In particular, the III-N material is of crystalline, especially single-crystalline nature.

The material system III-N plays an important role among todays semiconductor materials. It is used for a number of important optoelectronic and electronic devices. These devices are based on semiconductor layer structures epitaxially grown on suitable substrate crystals. Epitaxial growth usually yields the best results if homoepitaxy is performed, i.e. the layers are grown on a substrate of the same composition. Thus III-N for homoepitaxy are desirable. However, such III-N substrates are almost not commercially available, since their production presents a mayor challenge [I. Grzegory and S. Porowski, in Gallium Nitride and Related Semiconductors, 1999, INSPEC, B1.1, 359-366].

One possibility to provide III-N substrates is the deposition of thick III-N layers. The heteroepitaxial growth of thick GaN layers using hydride vapour phase epitaxy (HVPE) has been developed in recent years by a number of research groups [S. S. Park, I. Park, and S. H. Choh, Jpn. J. Appl. Phys. 39, L1141 (2000); and X. Xu, R. P. Vaudo, C. Loria, A. Salant, G. R. Brandes, and J. Chaudhuri, J. Cryst. Growth 246, 223 (2002)]. The aim of these developments is the replacement of foreign substrates like sapphire ($Al_2O_3$) and SiC for GaN-based technology since the use of such foreign substrates limits the device performance. The main reason for these limitations is the high defect density resulting from heteroepitaxy on foreign substrates with mismatch in lattice constant and thermal expansion coefficient. When growing thick layers better results can be achieved when growth is not started directly on the foreign substrate but on a thin III-N layer grown on this foreign substrate. [T. Paskova et al., phys. stat. sol. (a), 1999, 176, 415-419]. In the literature and in the following description, this combination comprising at least one foreign substrate and at least one thin III-N layer is referred to as template.

Using such templates grown by HVPE, electronic and optoelectronic devices have been produced, especially GaN laser diodes [S, Nagahama, T. Yanamoto, M. Sano, and T. Mukai, Jpn. J. Appl. Phys. 40, 3075 (2001); and M. Kuramoto, C. Sasaoka, Y. Hisanaga, A. Kimura, A. Yamaguchi, H. Sunakawa, N. Kuroda, M. Nido, A. Usui, and M. Mizuta, Jpn. J. Appl. Phys. 38, L184 (1999)] and light emitting diodes (LEDs) with emission in the UV spectral region [X. A. Cao, S. F. LeBoeuf, M. P. DEvelyn, S. D. Arthur, J. Kretchmer, C. H. Yan, and Z. H. Yang, Appl. Phys. Lett. 84, 4313 (2004)]. However, these templates still suffer from a number of problems. They usually show strong bowing and a pronounced tendency for formation of cracks. Both adverse effects derive from the different thermal expansion of GaN and the foreign substrate, usually sapphire. Moreover, GaN layers grown by the HVPE method usually suffer from a rough surface requiring further polishing steps before they can be used as templates for further epitaxial growth [S. S: Park et al., supra; and L. Liu and J. H. Edgar, Mat. Sci. Engin. R 37, 61 (2002)].

The sensitivity for formation of cracks depends—in addition to the choice of foreign substrate—strongly on the nucleation or buffer layer formed between foreign substrate and layer or template respectively used for HVPE growth. Typically we use 1.5 µm thick GaN templates, which are produced by metal-organic vapour phase epitaxy (MOVPE) on 2" sapphire wafers. We noticed that thicker layers without cracks can be grown in HVPE if, instead of the conventional GaN nucleation layer, a nucleation layer made of AlN grown at low temperature [B. Kuhn and F. Scholz, phys. stat. sol. (a) 188, 629 (2001)] is used in the MOVPE process for template fabrication [F. Habel, P. Bruckner, and F. Scholz, J. Cryst. Growth 272, 515 (2004)]. Apparently, the resulting higher compressive strain of the nucleation layer at room temperature is responsible for this improvement since it reduces or eliminates the net tensile strain at typical HVPE growth temperatures of around 1000° C. Even thicker layers free of cracks can be grown on patterned templates (for example selectively grown GaN stripes) [P. Bruckner, F. Habel, and F. Scholz (2005), Contribution to ICNS 6, Bremen, Germany, August 2005].

In earlier studies [F. Habel, P. Bruckner, J. Tsay, W. Liu, F. Scholz, D. Schmitz, and M. Heuken, phys. stat. sol. (c) 2, 2049 (2005)] we observed significant differences in the morphology of GaN layers grown by HVPE. These differences apparently were related to the choice of the templates. Other layer properties assessed by standard characterization methods (optical microscopy, x-ray diffraction, photoluminescence spectroscopy, atomic/scanning force microscope) did not reveal significant differences. Therefore in the following we focussed on template properties not studied in depth in the earlier investigations.

Only recently it was reported by some groups that the surface morphology of thin GaN layers [T. Yuasa, Y. Ueta, Y. Tsuda, A. Ogawa, M. Taneya, and K. Takao, Jpn. J. Appl. Phys. 38, L703 (1999); D. Lu, D. I. Florescu, D. S. Lee, V. Merai, J. C. Ramer, A. Parekh, and E. A. Armour, J. Cryst. Growth 272, 353 (2004); and Y. N. Drozdov, N. V. Vostokov, D. M. Gaponova, V. M. Daniitsev, M. N. Drozdov, O. I. Khrykin, A. S. Filimonov, and V. I. Shashkin, Semiconductors 39, 1 (2005)] or AlN layers [Q. Paduano and D. Weyburne, Jpn. J. Appl. Phys. 44, L150 (2005)] grown by MOVPE is improved by the use of sapphire wafers with a slight miscut (miscut angle around 0.3°). Such a behaviour is known from MOVPE [R. Sasaki, J. Cryst. Growth 160, 27 (1996); and M. Razeghi and J. P. Duchemin, J. Cryst. Growth 64, 76 (1983)] and HVPE [M. J. McCollum and G. E. Stillman, *High purity InP grown by hydride vapor phase epitaxy* (Academic Press, Boston, 1990), vol. 31 of *Semiconductors and Semimetals*, chap. 2, p. 37; H. Haspeklo, Ph. D. Thesis, Universitat Stuttgart (1984); and J. V. DiLorenzo, J. Cryst. Growth 17, 189 (1972)] of III arsenides and phosphides, where the group V element is arsenic and/or phosphorus instead of nitrogen. However, for these compounds optimum miscut angles are several degrees with 2° being a standard value. Such large miscut angles are not advantageous for III-N growth [O. Parillaud, V. Wagner, H. Buhlmann, F. Lelarge, and M. Ilegems, MRS Internet J. Nitride Semicond. Res. 5S1, W3.13 (2000); and B. Pecz, M. A. di Forte-Poisson, F. Huet, G. Radnoczi, L. Toth, V. Papaioannou, and J. Stoemenos, J. Appl. Phys. 86, 6059 (1999)] or even are disadvantageous and result in poorer morphology [K. Hiramatsu, H. Amano, I. Akasaki, H. Kato, N. Koide, and K. Manabe, J. Cryst. Growth 107, 509 (1991)]. Probably the relatively small optimum miscut angle for III-N epitaxial growth, especially on sapphire, has led to the fact that the advantageous effect of substrate miscut has long been overlooked.

Previous approaches to improve properties of III-N wafers by the use of patterned substrates can be summarized as follows:

Parillaud [MRS Internet Journal of Nitride Semiconductor Research, Vol. 5S1, Art. W3.13 (2000)] has studied HVPE growth on templates but has used relatively large miscut angles of the substrate in the range of 2° to 6°.

Ban (U.S. Pat. No. 6,734,530) describes a GaN-based wafer consisting of a III-N substrate and a III-N layer, where the surface of the III-N substrate has a miscut between 1° and 10°. Flynn (U.S. Pat. No. 6,447,604) also describes homoepitaxial growth by VPE; the possibility of substrate miscut is considered but not thought to be of critical importance. In both cases only homoepitaxial growth is considered which makes the availability of a III-N wafer or III-N substrate necessary. These methods are not suited for heteroepitaxial growth on foreign substrates and also not for the production of III-N wafers on the typical foreign substrates.

Kitaoka (US 2004/0144300 A1) describes a III-N substrate comprising a substrate and a III-N layer. The thin III-N layer on the substrate in a separate process step is bevelled to obtain a tilted surface. The starting substrate in contrast has no miscut. Thus a costly additional process step is necessary to obtain the tilted surface. This tilted III-N surface then is overgrown by liquid phase epitaxy (LPE).

Kainosho (JP 2002-274997 A) describes the growth of GaN-based semiconductors on perovskite substrates. A miscut of 1° to 4° with respect to the (011) crystal surface of the perovskite substrate has been chosen. This method does not relate to the use of typical foreign substrates for III-N growth like sapphire or silicon carbide, which due to their physical properties and their availability are especially suited for the growth of III-N layers.

Morishima (JP 2003-347226 A) describes growth of III-N layers on silicon-on-sapphire substrate with a miscut of below 0.5° in conjunction with a necessary additional reactive ion etching step of the template with a gas containing halogen. This step is necessary to provide a "mirror smooth" surface of the template for the subsequent III-N growth.

Matsuoka (U.S. Pat. No. 6,586,819, corresponding to EP01119516) describes the growth on sapphire substrate under rotation of the (0110)-plane around the c-axis in a range of 8° to 20°. Morita (U.S. Pat. No. 6,501,154) describes a III-N substrate, which may optionally have a miscut but has a surface perpendicular to the c-plane. These two methods thus are only suited for the production of III-N wafers with M-plane or A-plane surface but not with C-plane surface.

Summerfelt (U.S. Pat. No. 6,083,812, corresponding to EP94101374) describes heteroepitaxial growth of semiconductors like SiC, AlN or GaN on a ceramic foreign substrate which has a miscut of between 1° and 10°. Here, before the epitaxial growth of the semiconductor layer an annealing step at a temperature of at least 1200° C. for at least one hour as well as the growth of a ceramic buffer layer on the foreign substrate are necessary. According to the described embodiment these measures ensure that the buffer layer has a high surface quality before the growth of the semiconductor layer is started. Both buffer layer and semiconductor layer are grown by CVD. In the embodiment, a miscut (or "off-angle") of 5° against the c-axis was chosen and the grown SiC layer was 0.3 µm thick.

It is the object of the present invention is to provide thick III-N layers capable of being grown with a (0001)- or C-plane surface, and exhibiting improved surface properties, which thick III-N layers are particularly suited as substrate for further epitaxial growth steps.

According to a first aspect of the present invention an epitaxial growth process for producing a thick III-N layer is provided, wherein above a foreign substrate having a miscut (misorientation) of between 0.1° and 2° a III-N layer with a thickness of ≥40 µm is deposited.

For this subject-matter of the invention, epitaxial growh according to a preferred embodiment is performed by hydride vapour phase epitaxy (HVPE) on sapphire as foreign substrate, whereby the substrate miscut is well defined. The sapphire substrate is preferably crystalline and more preferably single crystalline.

Compared to a larger miscut of the foreign substrate with a miscut angle of above 2°, surprisingly a significant improvement in the surface morphology is achieved for miscut angles in the range of 0.1° to below 1° and especially in the range of 0.1° to around 0.6°.

Contrary to the state of the art, in which homoepitaxial growth is required and thus thick III-N layers have to be provided before growth, the invention can advantageously be applied to foreign substrates and especially sapphire substrates. Between a foreign substrate and a thick III-N layer preferably grown by HVPE, it is advantageous but not necessary to provide a thin III-N layer grown epitaxially, preferably by MOVPE, as template. Also direct growth by HVPE on sapphire is possible.

According to another aspect, the present invention provides a method for producing III-N substrates, wherein on a thin III-N layer of a template, comprising a foreign substrate and said thin III-N layer, a III-N layer with a thickness of at least 40 µm is grown, wherein the foreign substrate has a miscut (misorientation) of the substrate surface, on which growth is performed, with respect to the next crystallographic lattice plane.

For this subject-matter of the present invention, a template grown on a foreign substrate having a miscut acts as the basis for the deposition of a thick III-N layer. Within the framework of the present invention it has also been found that the production of a template on a foreign substrate with exact orientation and without miscut by deposition of a thin III-N layer may yield a smooth surface morphology of this thin layer, while further growth onto this smooth surface of the template—expecting this template to be of good quality—yields thick layers with microscopically rough surfaces often covered with a high density of hexagonal pyramids. According to the invention it was surprisingly found that when epitaxial growth was performed on a template whose foreign substrate had a slight miscut with respect to the next crystallographic lattice plane of its surface above which epitaxial growth occurs, and when a thin first III-N layer had been deposited thereon, thick III-N layers of at least 40 µm thickness were yielded with very smooth surface morphology, without additional steps like high temperature annealing (for example at a temperature of at least 1200° C. for at least an hour) and/or etching or polishing of the initial first III-N layer being necessary.

For this embodiment, first a thin III-N layer being thinner than the desired thick layer is deposited onto the foreign substrate having a slight miscut. Thus, for the method according the present invention a III-N substrate is not necessarily required. Onto this template a thick $Al_xGa_{(1-x)}N$ can be grown directly, alternatively by using further intermediate layers. Thus, a further treatment of the surfaces can be avoided. Particularly, etching by halogen-containing gases can be dispensed with. A thick III-N layer of at least 40 µm, preferably at least 50 µm, particularly at least 100 µm thickness has strongly improved surface properties, especially when for the intentional miscut a value of below 2°, and above all of below 1°, but above 0.1° is chosen, and furthermore when the thick III-N layer is grown by HVPE on a sapphire-III-N template grown by MOVPE. The sapphire substrate is preferably crystalline, in particular single crystalline.

According to a further aspect, the invention provides a method for producing III-N substrates, wherein in at least one step a III-N layer of at least 40 µm thickness is grown above a substrate by epitaxy at a prescribed N/III ratio and a prescribed reactor pressure, and wherein towards the end but before the end of the growth process the N/III ratio and/or the reactor pressure is lowered. During such end part of the growth process, III-N material shall still be grown but under said different conditions. In this embodiment the N/III ratio is reduced by preferably at least 25%, more preferably to a range of about 50% to about 5% and in particular to a range of about 7.5% to 25%, for example to about 10% of the N/III ratio prescribed for the previous part of the growth process, and/or the growth pressure in the reactor is reduced by preferably at least 20%, more preferably to a range of 25% to 65%, in particular to a range of about 45% to 55%, for example about 50% of the pressure prescribed for the previous part of the growth process.

It has been demonstrated that, surprisingly, the surface morphology can significantly be improved if the N/III ratio and/or the reactor pressure is lower in the last part of the epitaxial growth process. This even holds when exact substrates without the miscut given above are used. Since the advantage of the concept according to the invention especially is important for foreign substrates, the substrate preferably is such a foreign substrate like sapphire ($Al_2O_3$), SiC, GaAs, $Li(Al,Ga)O_x$ ($0 \leq x \leq 3$; in particular $x=2$) or other foreign substrates, or a template comprising such foreign substrate and a thin III-N layer. Likewise, the improvement of the surface morphology of III-N layers grown by HVPE by modification of the growth parameters towards the end of growth process according to this embodiment of the invention can also be applied to the homoepitaxial growth processes on native III-N substrates or templates. According to this embodiment an improvement of the surface morphology is particularly achieved if the growth of the thick III-N layer is performed by HVPE and when the reduction of the N/III ratio and/or the growth pressure in the HVPE reactor is prescribed in the last 60 minutes, preferably in the last 30 minutes and especially in the last 10 minutes of the growth process for the thick III-N layer. The surface quality can in this embodiment be even further improved if the foreign substrate has the misorientation (miscut) given above.

The invention therefore in the individual embodiments given above provides optimized growth conditions for a thick III-N layer above a substrate (i.e. onto a substrate or a template) for the start and the end of the epitaxial III-N growth process by HVPE.

The terms "misorientation" and "miscut" in relation to the invention mean a bevel or a tilt of the substrate surface, above which the growth of the thick III-N layer is performed, in a well defined direction with respect to a crystallographic plane of the crystal lattice. In case of sapphire as foreign substrate for example, where the growth of III-N layers usually is performed on the (0001) surface, the growth surface is slightly tilted with respect to the (0001) crystal plane of the sapphire. The direction of this misorientation can be freely chosen, for example to the A or {11-20} side of the substrate, which usually is marked by the orientation flat, or to the M or {1-100} side of the substrate. If for other foreign substrates other surfaces are suited for the growth of III-N layers according to the invention a substrate with a slight misorientation of the substrate surface with respect to the said crystallographic planes is used, especially with respect to {111} of silicon, {111} of gallium arsenide or {001} of lithium aluminate or lithium gallate.

Such a misorientation or miscut should furthermore be in the range of between 0.1° and 2°, preferably from about 0.1° to below 1.0°, more preferably from about 0.1° to about 0.6° and particularly from about 0.3° to about 0.6°.

In the above definitions III denotes at least one element of group III of the periodic table of elements. This III element should be chosen from the group Al, Ga and In as one single element or a combination of elements. A respective general formula is thus $Al_xGa_yIn_zN$ with $0 \leq x \leq 1$, $0 \leq y \leq 1$, $0 \leq z \leq 1$ and $x+y+z=1$. Examples for possible III-N compounds are quaternary compounds like (Al,Ga,In)N, ternary compounds like (Al,Ga)N, (Ga,In)N and (Al,In)N, or binary compounds like GaN or AlN. Amongst the chosen elements of the III. group, as exemplified in the above brackets, all possible percentages of mixtures are possible, i.e. from 0 to 100% of atoms of the respective element (for example $(Al,Ga)N=Al_xGa_{1-x}N$, where $0 \leq x \leq 1$). (Al,Ga)N and GaN are particularly preferred. The following description of particular embodiments is not limited to the III-N compounds given there but can be applied to all possible III-N compounds. Furthermore, the compositions of the thin first III-N layer and the thick III-N layer can be chosen independent of each other. The compositions can be the same or can be different. The III-N layer produced by the process steps, especially the thin III-N layer grown by MOVPE and the thick III-N layer grown by HVPE, preferably are crystalline, particularly single crystalline. Particularly suited in combination with sapphire substrates are thin layers containing GaN or AlN and thick layers of GaN.

It is possible, but usually not necessary that the thickness of the optionally deposited thin III-N layer exceeds about 10 µm. Usually, the thickness is at most about 5 µm and, if such a thin layer is used, typically falls in the range of above 0 to about 3 µm, for example from about 1 µm up to about 2 µm.

With the substrate including the thick III-N layer, diameters of at least 2 inch (about 5 cm), at least 3 inch (about 7.6 cm) or at least 4 inch (about 10 cm) or more can be obtained.

According to the invention a substrate with a III-N layer can be provided, wherein the layer surface has an average roughness of ≤50 nm and even of ≤40 nm. The average roughness can for example be measured by surface profilometry or Atomic Force Microscopy (AFM). According to the invention it is possible that the excellent and extremely small roughness is preserved for a thickness of the thick III-N layer of at least about 40 µm, preferably at least about 50 µm, more preferably at least about 100 µm and particularly at least about 300 µm. A III-N substrate is obtainable with the method described above. After removal of the initial foreign substrate a freestanding III-N substrate is provided.

In this way it is possible to achieve a unique combination of the wafer properties given above, wherein an extremely low average surface roughness over the whole wafer and not only in limited areas is combined with a desired layer thickness that is sufficient for free-standing III-N layers of desired diameters, if such free-standing form is required or desired.

The III-N layer produced according to the invention with improved surface morphology is suited as substrate for further epitaxial growth steps for the manufacture of semiconductor devices. Thermal, mechanical and/or chemical processes that attack the crystal, for example to smooth the surface of the thick III-N layer, can advantageously be avoided or omitted, if desired. Simple cleaning or washing steps for example with solvents that do not attack the crystal can of course always be used, if desired.

According to the invention furthermore a semiconductor device on a foreign substrate with a thick III-N layer having a thickness ≥40 μm is provided, wherein the foreign substrate has a misorientation or miscut in the range of between 0.1° and 2°, preferably from about 0.1° to below 1.0°, more preferably from about 0.1° to about 0.6° and particularly from about 0.3° to about 0.6°. The foreign substrate preferably is sapphire, particularly single crystalline sapphire.

Further, a device provided by the invention comprises a III-N substrate having a thickness ≥40 μm and having an average surface roughness of ≤50 nm as defined above.

The thick III-N layer or the III-N substrate in the above semiconductor devices according to the invention have thicknesses in the range of ≥about 100 μm and particularly ≥about 300 μm.

The III-N material has the compositions given above, preferably it is GaN, particularly single crystalline GaN.

The average surface roughness of the thick III-N layer of the above-mentioned III-N substrate or the above-mentioned devices can be in the range of ≤40 nm and even ≤30 nm. A further feature of the substrate or the device according to the invention is that this extremely low surface roughness is obtained without polishing or etching. Also the thin III-N layer does not require polishing or etching. This reduces the defect density especially with respect to defects directly under the treated surface that are easily introduced during etching and/or polishing (subsurface damages).

An optimization of the surface properties according to the invention can be achieved by combination of one or several of the above-mentioned process and/or product features of the respective embodiments according to the invention. As an example, the use of MOVPE for the optional thin III-N layer and the uses of HVPE for the thick III-N layer allows for an especially advantageous combination of process parameters like temperature, pressure and N/III ratio in the reactor chamber.

In the following, the invention is described in further detail by preferred embodiments and examples with reference to the attached drawings. The given preferred embodiments and examples only are meant for illustration and by no means shall limit the scope of the invention.

FIG. 1 shows photoluminescence spectra at low temperature (T around 20 K) of two templates, which have been grown side by side in the same MOVPE process run. The solid line refers to a template grown on a sapphire foreign substrate with exact orientation, the dashed line to a template on a sapphire foreign substrate with 0.3° misorientation (miscut). The spectral shape of the curves is relevant and thus the intensity of the latter sample has been shifted by a factor of 2.

FIGS. 2A and 2B show optical Nomarski interference contrast microscopy images of the surfaces of two representative thick GaN layers, which have been grown by HVPE on the respective MOVPE templates of FIG. 1, wherein FIG. 2A shows a layer on the template comprising the sapphire foreign substrate having exact orientation and FIG. 2B that on the template comprising the sapphire foreign substrate having 0.3° misorientation (miscut).

Figure 5:
Figure 5:
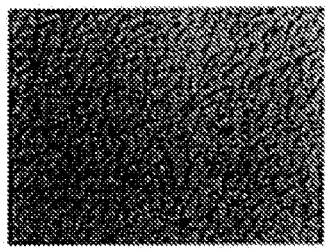
Figure 5:
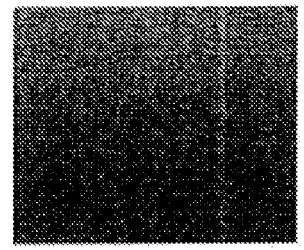
Figure 5:
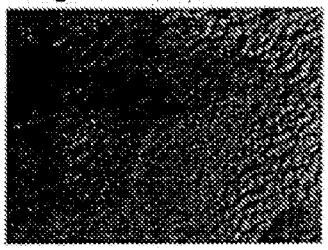
Figure 5:
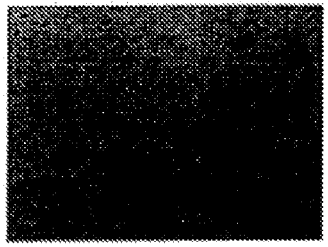
Figure 5:
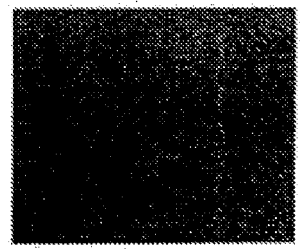
Figure 5:
Figure 5:
Figure 5:
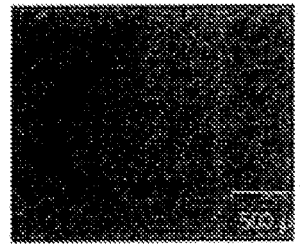

FIG. 5 shows optical Nomarski interference contrast microscopy images of the surfaces of two representative GaN layers grown by HVPE on sapphire foreign substrates having different misorientation angles. The columns show the results of HVPE growth processes on sapphire substrates with exact orientation (left), with a misorientation of 0.3° (middle) and of 0.6° (right). The process conditions were either kept constant for the whole growth duration (upper row) or were changed towards the end of the growth process with respect to the N/III ratio (middle row) or the pressure at growth (lower row).

EXAMPLES

Example 1

As an example, a thin GaN layer can be grown onto a sapphire foreign substrate having a misorientation of 0.3° in an Aixtron 200/4RF-S MOVPE system. The thickness of this thin GaN layer for example is below 2 μm, particularly between 1 and 2 μm. This template is deloaded from the MOVPE reactor and loaded into an Aixtron LP-HVPE reactor. There, a thick GaN layer with a thickness of several hundred μm is grown onto this template. The HVPE process for example is carried out at a temperature of between 1040° C. and 1075° C. and at a pressure of between 900 and 1000 mbar at an N/III ratio of about 40 in a mixture of about 50% hydrogen and about 50% nitrogen as carrier gas. The growth rate in this example is about 40 μm/h. Through the use of foreign substrates with a slight misorientation a significantly improved surface morphology after HVPE growth is provided. Even though the layer thickness of the thick GaN layer is 40 μm or higher, the surface morphology is comparable to the one of significantly thinner layers grown by MOVPE. Accordingly, the layer provided according to this embodiment of the invention is well suited to be used as substrate for subsequent epitaxial growth for example of layers for semidonductor devices without any further treatment steps.

Example 2

In the framework of the invention several templates on sapphire foreign substrates with misorientation were compared to conventional ones with exact orientation by using them side by side in the same HVPE growth process.

All HVPE growth processes were performed in an AIXTRON single wafer HVPE system with horizontal quartz reactor. As usual metallic Ga is fed by HCl gas to the substrate. Ammonia is used as source for nitrogen. The Ga source was operated at 850° C. while the substrate zone was heated to 1040-1075° C. A 1:1 mixture of $N_2$ and $H_2$ was used as carrier gas. The experiments were performed at atmospheric pressure and a N/III ratio of about 40.

All HVPE-grown layers were deposited onto GaN templates which had been grown on 2 inch sapphire wafers as foreign substrates by MOVPE. Up to four different templates could be used in parallel by loading four quarters prepared from different templates by cleaving. Under our typical growth conditions a growth rate of around 40 μm/h was obtained. The templates and the thick layers produced by HVPE growth with thicknesses of between 40 and 140 μm were characterized using standard methods like optical microscopy, high resolution x-ray diffraction (HRXRD), low temperature photoluminescence (PL) and surface profilometry.

These measurements revealed that the layer properties of the templates were very similar except for the misorientation. The low temperature PL spectra of two templates grown in parallel on a multiwafer MOVPE reactor are exemplarily shown in FIG. 1. The two templates differ only slightly in their surface quality and thereby illustrate the results discussed above. Especially no differences were found in the strain of the layers or the linewidth of PL spectra or HRXRD rocking curves. The GaN layers on these wafers possessed the same misorientation like the sapphire substrate on which they were grown. We found a maximum tilt of the thin GaN layer grown by MOVPE with respect to sapphire substrate of around 200 arcsec.

Thus it can be stated that, surprisingly, the thin III-N layer surfaces and further properties did not show differences between exact orientation and a slight misorientation.

Immediately before the HVPE process the templates were washed in standard solvents to remove dust, particles and further contaminations derived form wafer handling. No correlation between surface morphology and storage time of the templates between the MOVPE growth and their usage for HVPE growth was found for a range of only several hours and up to several months. Thus significant influences by oxidation of the surface or by other factors can surely be excluded.

Figure 3:
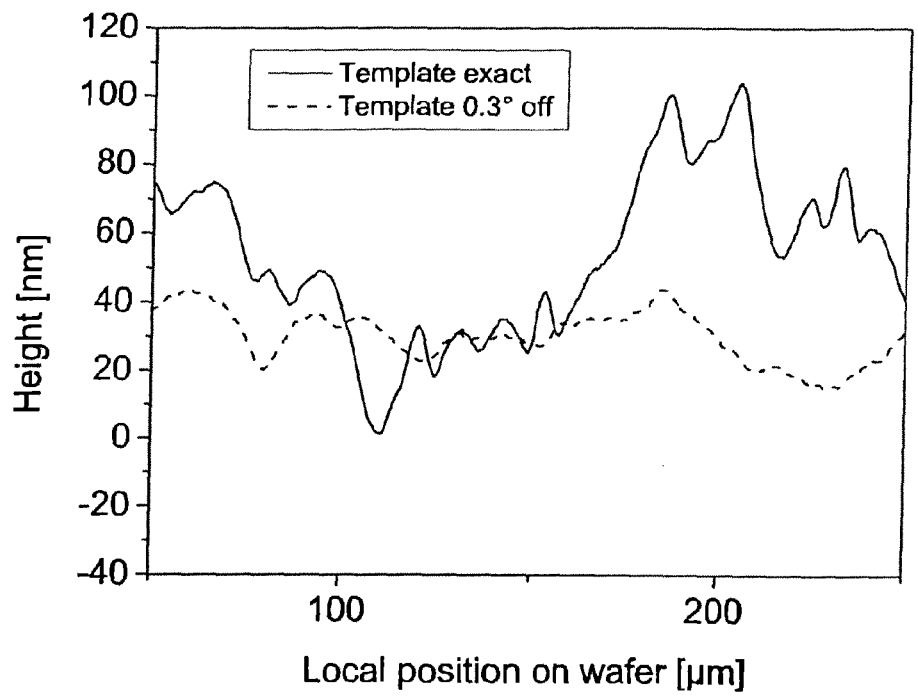
FIG. 3 shows the surface profiles (measured by surface profilometry) of GaN layers grown by HVPE on a template with exact orientation (solid line) or on a template with 0.3° misorientation (dashed line).

On the other hand we found evident indications that the slight misorientation is responsible for the obtained excellent surface morphology. The thick layers grown by HVPE on the misoriented templates even for thicknesses of 100 μm and above shower mirror-like surface morphology (FIG. 2), which can readily be compared to state-of-the-art significantly thinner layers grown by MOVPE, while on templates with exact orientation in general high pyramids are formed as usually found for thick layers grown conventionally by HVPE. This higher roughness for exact orientation is also revealed and can be quantified by surface profilometry (FIG. 3).

It is assumed that the epitaxial growth is controlled by step-flow induced by the surface steps on the slightly misoriented substrates [W. K. Burton, N. Cabrera, and F. C. Frank, Phil. Trans. A 243, 299 (1951)]. For a misorientation of 0.3° these steps have an average distance of about 50 nm. This apparently is smaller than the diffusion length of the Ga atoms adsorbed to the surface [typically, only the group-III atoms have to be considered due to the high N/III ratio and the easy desorption of the N atoms]. At the same time the step distance is significantly smaller than the average distance of dislocations (about 300 nm at a dislocation density of $10^9$ cm$^{-2}$ which is typical for thin templates). This could be the reason for the suppression of three-dimensional nucleation at dislocations in favour of two-dimensional growth at step edges.

Figure 4:
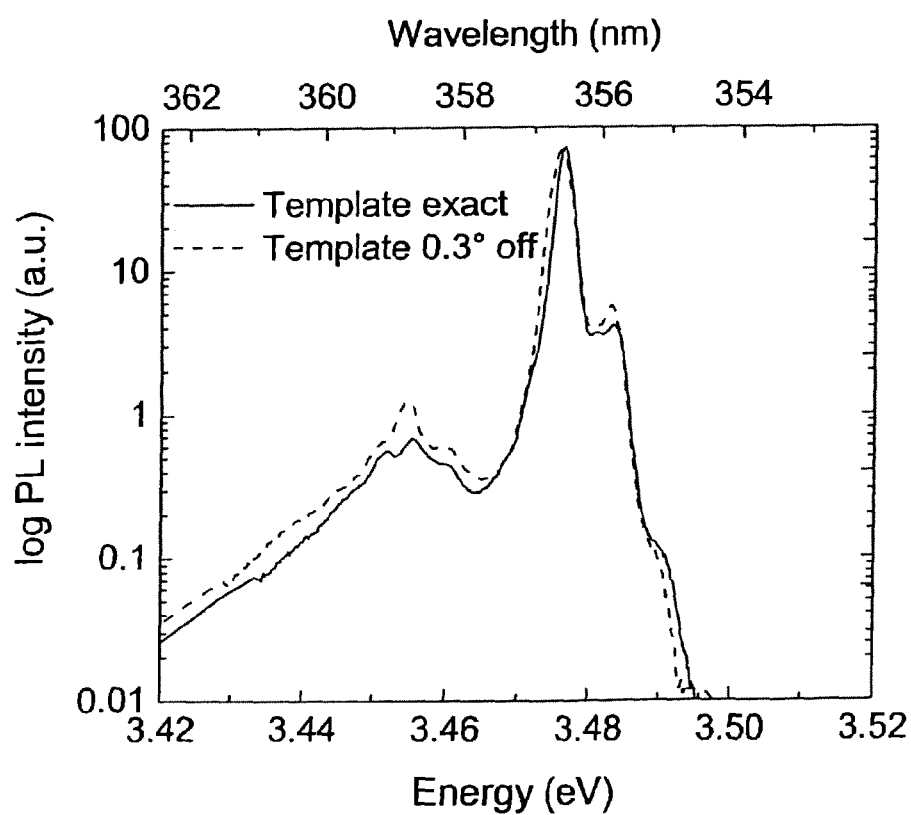
FIG. 4 shows photoluminescence spectra at low temperature (T around 20 K) of the two layers from FIGS. 2A and 2B.

As already observed for the templates, also the thick layers grown by HVPE showed no significant differences in their optical and crystalline properties except for the improved surface morphology when a slight misorientation (miscut) is used. It again should be stressed that the strain in the layers as indicated by the energy of the donor-bound excitons in PL is the same irrespective of the orientation of the substrate (FIG. 4).

In summary the surface quality of thick GaN layers grown by HVPE can significantly be improved by the use of substrates with a slight miscut (e.g. about 0.3° while growth on substrates with exact orientation leads to the formation of pyramids commonly observed for thick layers conventionally grown by HVPE. Thus the layers grown on substrates with misorientation are ideally suited as substrates for further epitaxial growth steps without additional preparation steps being necessary.

Example 3

The process described in example 2 was modified as follows:

Example 3.1

The HVPE process on templates with exact orientation (without miscut) or with a misorientation with an off-angle (miscut) of 0.3° or with an off-angle (miscut) of 0.6°, is performed at otherwise constant conditions with respect to pressure and N/III ratio up to the end of epitaxial growth.

Example 3.2

Like in Example 3.1, but with a reduction of the N/III ratio from 40 to 5 at unchanged pressure for the last 10 minutes of epitaxial growth.

Example 3.3

Like in Example 3.1, but with a reduction of the N/III ratio from 40 to 5 and a reduction of the pressure for growth from 900 mbar to 500 mbar for the last 10 minutes of epitaxial growth.

For a valid and unambiguous comparison in each epitaxial growth process four wafer parts (each ¼ of a 2 inch wafer) were deposited in parallel, so that the layers on the different template types with and without misorientation were grown under identical growth conditions.

The results are summarized in FIG. 5.

For all process conditions used the surface quality was worst for exact orientation, even though also in this worst case the surface quality could significantly be improved by variation of the N/III ratio and especially variation of the N/III ratio as well as the growth pressure (see left column).

Without variation of N/III ratio and growth pressure a misorientation of 0.6° was superior to 0.3°. When reducing only the N/III ratio at the end of the growth process the result on 0.3° was better but still the surface quality for 0.6° misorientation was very good.

The best results were obtained with the optimized combination of an only slight misorientation, preferably of 0.3°, and a reduction of N/III ratio and pressure towards the end of the epitaxial growth process. This combination yielded exceptionally good surface quality.

Although the invention has been described in detail by embodiments and examples, variations and modifications will become obvious to the person skilled in the art. The following claims thus have to be interpreted in the widest possible manner in comparison to the state of the art with all variations and modifications included within the scope of the invention.

The invention claimed is:
1. A substrate comprising a III-N layer, wherein III denotes at least one element of group III of the periodic table of elements, wherein the III-N layer, at least on one side, has an average surface roughness of 50 nm or below over the whole substrate surface wherein said surface roughness is a measure of the III-N layer when not subjected to annealing, polishing and/or etching.

2. The substrate according to claim 1, wherein the III-N layer, on said at least one side, has an average surface roughness of 40 nm or below over the whole substrate surface.

3. The substrate according to claim 1, wherein the III-N layer has a thickness of at least about 40 µm.

4. The substrate according to claim 1, wherein the III-N layer is single crystalline.

5. The substrate according to claim 1, obtained by a process of epitaxial growth for producing a thick III-N layer, wherein III denotes at least one element of group III of the periodic table of elements, wherein a thick III-N layer having a thickness of ≥40 µm is deposited above a foreign substrate having a misorientation between 0.1° and 2°, wherein a foreign substrate selected from sapphire, SiC, GaAs and Li(Al;Ga)O$_x$ (0 ≤ x ≤ 3) is used as foreign substrate.

6. The substrate according to claim 1, obtained by a process for producing a III-N substrate, wherein III denotes at least one element of group III of the periodic table of elements, the process comprising a step in which a III-N layer having a thickness of at least 40 µm is deposited above a substrate by epitaxial growth under a predetermined N/III ratio and a predetermined reactor pressure, wherein towards the end of the epitaxial growth process for the III-N layer the N/III ratio and/or the pressure in the reactor is(are) lowered relative to the predetermined N/III ratio and/or the predetermined reactor pressure, respectively.

7. A semiconductor device comprising a substrate according to claim 1.

8. The semiconductor device according to claim 7, comprising:
   a template, which comprises a foreign substrate and a thin III-N layer deposited thereon, wherein III denotes at least one element of group III of the periodic table of elements; and
   a thick III-N layer having a thickness of at least 40 µm deposited on said thin III-N layer, wherein III denotes at least one element of group III of the periodic table of elements;
   wherein the foreign substrate has a slight intentional misorientation with respect to the next crystallographic lattice plane of its surface onto which the III-N layer is deposited.

9. The substrate according to claim 1, wherein the III-N layer, on said at least one side; has an average surface roughness of 30 nm or below over the whole substrate surface.

10. The substrate according to claim 1, wherein the III-N layer has a thickness of at least about 100 µm.

11. The substrate according to claim 1, wherein the III-N layer has a thickness of at least about 150 µm.

12. The substrate according to claim 1, wherein the III-N layer is single crystalline GaN.

13. The substrate according to claim 1, consisting of said III-N layer in a free-standing form.

* * * * *